(12) United States Patent
Lu et al.

(10) Patent No.: US 6,358,836 B1
(45) Date of Patent: Mar. 19, 2002

(54) WAFER LEVEL PACKAGE INCORPORATING ELASTOMERIC PADS IN DUMMY PLUGS

(75) Inventors: Szu-Wei Lu, Hsin Chu; Kuo-Chuan Chen, Hsinchu; Jyh-Rong Lin; Ruoh-Huey Wang, both of Taipei; Hsu-Tien Hu; Hsin-Chien Huang, both of Hsinchu, all of (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 09/595,823

(22) Filed: Jun. 16, 2000

(51) Int. Cl.[7] .......................................... H01L 21/4763
(52) U.S. Cl. ...................... 438/618; 438/108; 438/118; 438/119; 438/613; 438/614
(58) Field of Search .................................. 438/106, 107, 438/108, 118, 119, 612, 613, 614, 618

(56) References Cited

U.S. PATENT DOCUMENTS 5,851,911 A  * 12/1998  Farnworth ................... 438/614
6,050,832 A  *  4/2000  Lee et al. ...................... 438/91
6,197,613 B1 *  3/2001  Kung et al. ................... 438/106

* cited by examiner

*Primary Examiner*—Long Pham
(74) *Attorney, Agent, or Firm*—Tung & Associates

(57) ABSTRACT

A method for forming a wafer level package by incorporating an insulating pad of an elastic material under a dummy plug is described. In the method, a multiplicity of pads or islands formed of an elastic material is first formed on a pre-processed semiconductor substrate before a multiplicity of dummy via plugs are formed on top. The dummy via plugs are used as a support structure for building I/O redistribution lines (i.e. metal traces) thereon such that I/O bond pads may be built for supporting solder bumps or solder balls. The multiplicity of insulating pads is used for stress relief during a bonding process with the solder ball built on top without the conventional defect of cracking due to high elasticity of the material when a large area insulating layer is deposited on top. Numerous processing advantages are provided by the present invention method which includes the elimination of direct contact between an elastomeric material layer and a polyamide passivation layer such that potential cracking of the polyamide layer or breaking of I/O redistribution lines can be avoided.

15 Claims, 6 Drawing Sheets

WAFER LEVEL PACKAGE INCORPORATING ELASTOMERIC PADS IN DUMMY PLUGS

FIELD OF THE INVENTION

The present invention generally relates to a wafer level package and a method for forming and more particularly, relates to a wafer level package that utilizes elastomeric pads in dummy plugs for forming I/O redistribution and a method for forming such package.

BACKGROUND OF THE INVENTION

In the fabrication of modern semiconductor devices, the ever increasing device density and decreasing device dimensions demand more stringent requirements in the packaging or interconnecting techniques of such high density devices. Conventionally, a flip-chip attachment method has been used in packaging of semiconductor chips. In the flip-chip attachment method, instead of attaching a semiconductor die to a lead frame in a package, an array of solder bumps is formed on the surface of the die. The formation of the solder bumps may be carried out in an evaporation method by using a composite material of tin and lead through a mask for producing a desired pattern of solder bumps. The technique of electrodeposition has been more recently developed to produce solder bumps in flip-chip packaging process.

Other techniques that are capable of solder-bumping a variety of substrates to form solder balls have also been proposed. The techniques generally work well in bumping semiconductor substrates that contain solder structures over a minimal size. For instance, one of such widely used techniques is a solder paste screening method which has been used to cover the entire area of an eight inch wafer. However, with recent trend in the miniaturization of device dimensions and the necessary reduction in bump-to-bump spacing (or pitch), the use of the solder paste screening technique has become impractical for several reasons. One of the problems in utilizing solder paste screening technique in bonding modern semiconductor devices is the paste composition itself. A solder paste is formed by a flux material and solder alloy particles. The consistency and uniformity of the solder paste composition become more difficult to control as the solder bump volume decreases. Even though a solution of the problem has been proposed by using solder paste that contain extremely small and uniform solder particles, it can only be achieved at a high cost penalty. A second problem in utilizing the solder paste screening technique in modern high density semiconductor devices is the available space between solder bumps. It is known that a large volume reduction occurs when a solder changes from a paste state to a cured stated, the screen holes for the solder paste must be significantly larger in diameter than the actual solder bumps to be formed. The large volume shrinkage ratio thus makes the solder paste screening technique difficult to carry out in high density devices.

Other techniques for forming solder bumps such as the controlled collapse chip connection (C4) technique and the thin film electrodeposition technique have also been used in recent years in the semiconductor fabrication industry. The C4 technique is generally limited by the resolution achievable by a molybdenum mask which is necessary for the process. Fine-pitched solder bumps are therefore difficult to be fabricated by the C4 technique. Similarly, the thin film electrodeposition technique which also requires a ball limiting metallurgy layer to be deposited and defined by an etching process which has the same limitations as the C4 technique. For instance, a conventional thin film electrodeposition process for depositing solder bumps is shown in FIGS. 1A~1F.

A conventional semiconductor structure 10 is shown in FIG. 1A. The semiconductor structure 10 is built on a silicon substrate 12 with active devices built therein. A bond pad 14 is formed on a top surface 16 of the substrate 12 for making electrical connections to the outside circuits. The bond pad 14 is normally formed of a conductive metal such as aluminum. The bond pad 14 is passivated by a final passivation layer 20 with a window 22 opened by a photolithography process to allow electrical connection to be made to the bond pad 14. The passivation layer 20 may be formed of any one of various insulating materials such as oxide, nitride or organic materials. The passivation layer 20 is applied on top of the semiconductor device 10 to provide both planarization and physical protection of the circuits formed on the device 10.

Onto the top surface 24 of the passivation layer 20 and the exposed top surface 18 of the bond pad 14, is then deposited an under bump metallurgy layer 26. This is shown in FIG. 1B. The under bump metallurgy (UBM) layer 26 normally consists of an adhesion/diffusion barrier layer 30 and a wetting layer 28. The adhesion/diffusion barrier layer 30 may be formed of Ti, TiN or other metal such as Cr. The wetting layer 28 is normally formed of a Cu layer or a Ni layer. The UBM layer 26 improves bonding between a solder ball to be formed and the top surface 18 of the bond pad 14.

In the next step of the process, as shown in FIG. 1C, a photoresist layer 34 is deposited on top of the UBM layer 26 and then patterned to define a window opening 38 for the solder ball to be subsequently formed. In the following electrodeposition process, a solder ball 40 is electrodeposited into the window opening 38 forming a structure protruded from the top surface 42 of the photoresist layer 34. The use of the photoresist layer 34 must be carefully controlled such that its thickness is in the range between about 30 $\mu$m and about 40 $\mu$m, preferably at a thickness of about 35 $\mu$m. The reason for the tight control on the thickness of the photoresist layer 34 is that, for achieving a fine-pitched solder bump formation, a photoresist layer of a reasonably small thickness must be used such that a high imaging resolution can be achieved. It is known that, during a photolithography process, the thicker the photoresist layer, the poorer is the imaging process. To maintain a reasonable accuracy in the imaging process on the photoresist layer 34, a reasonably thin photoresist layer 34 must be used which results in a mushroom configuration of the solder bump 40 deposited therein. The mushroom configuration of the solder bump 40 contributes greatly to the inability of a conventional process in producing fine-pitched solder bumps.

Referring now to FIG. 1E, wherein the conventional semiconductor structure 10 is shown with the photoresist layer 34 removed in a wet stripping process. The mushroom-shaped solder bump 40 remains while the under bump metallurgy layer 26 is also intact. In the next step of the process, as shown in FIG. 1F, the UBM layer 26 is etched away by using the solder bump 40 as a mask in an wet etching process. The solder bump 40 is then heated in a reflow process to form solder ball 42. The reflow process is conducted at a temperature that is at least the reflow temperature of the solder material.

In recent years, chip scale packages (CSP) have been developed as a new low cost packaging technique for high volume production of IC chips. One of such chip scale packaging techniques has been developed by the Tessera Company for making a so-called micro-BGA package. The micro-BGA package can be utilized in an environment where several of the packages are arranged in close proximity on a circuit board or a substrate much like the arrangement of individual tiles. Major benefits achieved by a micro-BGA package are the combined advantages of a flip chip assembly and a surface mount package. The chip scale packages can be formed in a physical size comparable to that of an IC chip even though, unlike a conventional IC chip such as a flip chip, the chip scale package does not require a special bonding process for forming solder balls. Furthermore, a chip scale package may provide larger number of input/output terminals than that possible from a conventional quad flat package, even though a typical quad flat package is better protected mechanically from the environment.

A unique feature of the chip scale package is the use of an interposer layer that is formed of a flexible, compliant material. The interposer layer provides the capability of absorbing mechanical stresses during the package forming steps and furthermore, allows thermal expansion mismatch between the die and the substrate. The interposer layer, therefore, acts both as a stress buffer and as a thermal expansion buffer. Another unique feature of the chip scale package, i.e. such as a micro-BGA package, is its ability to be assembled to a circuit board by using conventional surface mount technology (SMT) processes.

In a typical micro-BGA package, a flexible interposer layer (which may contain circuit) is used to interconnect bond pads on an IC chip to an array of solder bump connections located on a flexible circuit. The flexible circuit, normally of a thickness of approximately 25 µm, is formed of a polymeric material such as polyimide which is laminated to a silicon elastomer layer of approximately 150 µm thick. The silicon elastomeric layer provides flexibility and compliance in all three directions for relief of stresses and thermal expansion mismatches.

To further reduce the fabrication cost of IC devices, it is desirable that if a whole wafer can be passivated to seal the IC dies on the wafer, and then be severed into individual IC dies from the wafer such that not only the benefits of a chip scale package can be realized, the packaging cost for the IC dies may further be reduced.

A large number of IC chips are designed with a peripheral array of I/O pads. For modern high density devices, the pitch allowed between I/O pads is steadily decreasing. An I/O pad redistribution process is frequently necessary for changing a peripheral array to an area array in order to improve pitch between the conductive pads. During the redistribution process, metal traces are frequently used to extend bond pads from a peripheral area to a center area on the chip. Due to the limited space available for the metal traces, especially those traces that run an extended distance, it is desirable to produce metal traces that are stress buffered in order to assure the reliability of a chip.

In a co-pending application assigned to the common assignee of the present application, Ser. No. 09/274,611, filed Mar. 23, 1999, which is incorporated in its entirety herewith by reference, a method for forming a wafer level package that contains a multiplicity of IC dies each having an I/O redistribution is disclosed. In the method, as depicted in FIG. 2, a wafer level package 44 is formed by first providing a silicon wafer (not shown) which has a multiplicity of IC dies 46 formed on a top surface. Each of the multiplicity of IC dies 46 has at least one first I/O pad 48 formed in a first insulating layer 50. At least one via plug 52 is then formed of a first conductive metal material on top of the at least one first I/O pad 48. A layer of second insulating material 54 that has sufficient elasticity is then coated on the top surface of the IC die 46 leaving a top surface of the at least one via plug 52 substantially exposed from the insulating material layer 54. A second conductive metal layer 56 is then deposited on top of the second insulating material layer 54 to form at least one metal trace 58 with a first end electrically connecting the at least one via plug 52 and a second end extending away from the first end. A third insulating material layer 60 is then deposited on top of the at least one metal trace 58 and is defined to expose at least one second I/O pad at the second end of the at least one metal trace 58. Depositing a UBM (under-bump-metallurgy) layer 62 and forming at least one solder ball 66 on a top surface 64 of the UBM layer 62.

The method shown in FIG. 2, while providing an adequate stress buffer layer 54 for the solder balls 66, requires the step of coating the entire surface of the IC die 46 with an elastomeric material layer, which is time-consuming and costly. A simplified method that is capable of achieving the same desirable stress buffering effect is therefore needed for providing wafer level packages at low cost.

In the wafer level package application depicted in FIG. 2, several processing and performance related problems have been discovered. First, since the elastomeric layer 54 is extensively covered by the polyimide layer 60 in order to provide isolation of the I/O redistribution line 66, and that the elastomeric layer 54 is formed of a material that has high elasticity, the polyimide layer 60 on top frequently forms cracks and becomes deficient in isolating the metal layer 56. A severe reliability problem thus occurs since the metal redistribution lines are no longer isolated by the passivation layer of polyamide. Secondly, the thick elastomeric layer 54 further presents another performance problem for the wafer level package. When the layers under the elastomeric layer 54 is grounded, the elastomeric layer 54 becomes a capacitor with a large capacitance, presenting a problem for the IC device. The wafer level package having the structure shown in FIG. 2 cannot be used when the capacitance of the elastomeric layer becomes an issue.

It is therefore an object of the present invention to provide a wafer level package for chip scale packaging (CSP) that does not have the drawbacks or shortcomings of the conventional wafer level packages.

It is another object of the present invention to provide a wafer level package by inserting an elastomeric pad into a dummy plug for forming I/O redistribution lines on the package.

It is a further object of the present invention to provide a wafer level package that utilizes an elastomeric pad for stress relieving while eliminating a direct contact of the elastomeric material with a polyimide passivation layer.

It is another further object of the present invention to provide a wafer level package that utilizes elastomeric pads at the bottom of dummy plugs for stress relieving without causing a capacitance problem for the package.

It is still another object of the present invention to provide a wafer level package that utilizes a stress relieving layer formed of a polyamide or a polyamide/elastomer material.

It is yet another object of the present invention to provide a method for fabricating a wafer level package by first forming dummy plugs on top of elastomeric pads and then building solder bumps on top of the dummy plugs such that the elastomeric pads serve the stress relieving function during a subsequent bonding process with the solder bumps.

It is still another further object of the present invention to provide a method for forming a wafer level package by forming via plugs in a layer of stress-relieving material formed of polyimide or polyamide/elastomer mixture.

It is yet another further object of the present invention to provide a method for fabricating a wafer level package by forming solder bumps on I/O redistribution pads on top of dummy plugs and elastomeric pads such that the elastomeric pads absorb bonding stress during a subsequent solder bonding process.

SUMMARY OF THE INVENTION

In accordance with the present invention, a wafer level package that utilizes an elastomeric pad in a dummy plug for stress relief of a solder bump built on top of the dummy plug and a method for forming the wafer level package are provided.

In a preferred embodiment, a method for forming a wafer level package can be carried out by the operating steps of first providing a wafer that has a multiplicity of IC dies formed on a top surface, each of the multiplicity of IC dies has a first I/O pad formed in a first insulating layer, forming an insulating pad of an elastic material on the first insulating layer at a location where a second I/O pad is to be formed, sputter depositing a first metal nucleation layer on the top surface of the wafer, coating a layer of a photoresist material of the top surface and patterning openings for via plugs on the first I/O pad and the insulating pad, filling the openings for via plugs with a metal filling the via plugs, removing the layer of photoresist material and etching away the first metal nucleation layer exposed, depositing a second insulating layer on the top surface of the wafer, dry etching away a surface layer of the second insulating layer exposing the via plugs, sputter depositing a metal layer on top of the wafer and defining an I/O redistribution line providing electrical communication between the via plugs, depositing a third insulating layer on top of the I/O redistribution line, defining and exposing an opening for the second I/O pad in the third insulating layer, and forming a solder bump on the second I/O pad over the insulating pad.

In the method for forming a wafer level package, the step of forming a solder bump may further include depositing an under-bump-metallurgy layer on the second I/O pad prior to forming the solder bump. The step of forming a solder bump may further include the steps of depositing an under-bump-metallurgy layer on the second I/O pad, depositing a fourth insulating layer overlying the under-bump-metallurgy layer, filling via holes formed in the fourth insulating layer on the second I/O pad with a solder material forming the solder bump, removing the fourth insulating layer, and reflowing the solder bump into a solder ball.

In the method for forming a wafer level package, the solder bump may be formed in the via hole by a technique of screen printing, stencil printing, electrodeposition, electroless deposition and pick-and-place solder balls. The insulating pad may be formed of an elastomeric material, or formed of an elastic material that has a Young's modulus of less than 20 MPa. The first I/O pad may be arranged in a peripheral array on the multiplicity of IC dies. The second I/O pad may be arranged in an area array on the multiplicity of IC dies. The insulating pad may be formed by a stencil printing technique. The openings for the via plugs may be formed by a photolithographic method. The first I/O pad and the second I/O pad may be formed of aluminum or copper. The via plugs may be formed of a material selected from the group consisting of aluminum, copper, aluminum alloys and copper alloys. The step of filling the openings for via plugs may be carried out by an electroplating or printing technique. The metal for forming the via plugs completely covers the insulating pad. The second insulating layer may be formed of a material of polyamide, polyamide/elastomer mixture or benzocyclobutene (BCB).

The present invention is further directed to a wafer level package that includes a wafer which has a multiplicity of IC dies formed on a top surface, each of the multiplicity of IC dies has a first I/O pad formed in a first insulating layer, an insulating pad of an elastic material formed on the first insulating layer at a location where a second I/O pad is to be formed, a first metal nucleation layer on top of the first I/O pad and the insulating pad, two via plugs formed in a second insulating layer over the first I/O pad and the insulating pad, respectively, and I/O redistribution line formed of a conductive metal providing electrical communication between the two via plugs, a third insulating layer on top of the I/O redistribution line, an opening in the third insulating layer exposing a second I/O pad on the via plug over the insulating pad, and a solder bump on the second I/O pad over the insulating pad.

In the wafer level package, the solder bump may further include an under-bump-metallurgy layer on the second I/O pad. The insulating pad may be formed of an elastomeric material. The insulating pad may have a diameter of at least 200 nm. The first I/O pad may be arranged in a peripheral array and the second I/O pad may be arranged in an area array. The second insulating layer may be formed of a material of polyimide, polyimide/elastomer mixture or BCB. The via plug under the second I/O pad partially covers the insulating pad.

BRIEF DESCRIPTION OF THE DRAWINGS

These and other objects, features and advantages of the present invention will become apparent from the following detailed description and the appended drawings in which.

DETAILED DESCRIPTION OF THE PREFERRED EMBODIMENT

The present invention discloses a method for forming a wafer level package by placing an insulating pad of an elastic material at the bottom of the via plugs and then forming I/O redistribution pad on top of the via plugs. The insulating pad of elastic material provides the vital stress relief function during a bonding process to a solder ball that is planted on the I/O redistribution pad.

The present invention novel method provides numerous processing advantages. One such processing advantage is the avoidance of direct contact of an elastomeric material, which may be used for forming the insulating pad, with an insulating material such as polyimide. Such direct contact has been found in conventional wafer level packages that utilize an elastomeric material layer for stress relief and a polyamide layer for passivation on top. A possible cracking of the polyimide layer due to the large elasticity of the elastomeric material can thus be avoided.

Figure 1A:
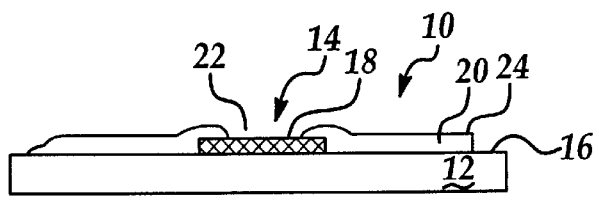
FIG. 1A is an enlarged, cross-sectional view of a conventional pre-processed semiconductor substrate which has a bond pad in a passivation layer formed on top.
Figure 1B:
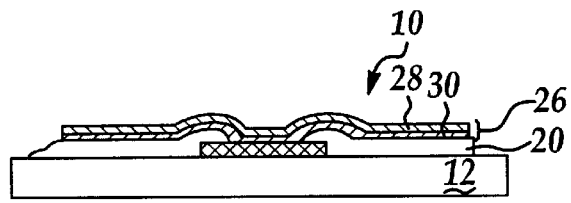
FIG. 1B is an enlarged, cross-sectional view of the conventional semiconductor structure of FIG. 1A with an under-bump-metallurgy (UBM) layer formed on top.
Figure 1C:
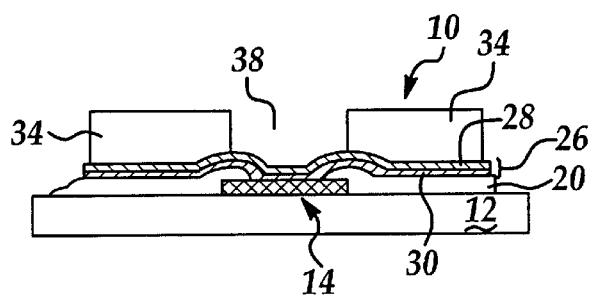
FIG. 1C is an enlarged, cross-sectional view of the conventional semiconductor structure of FIG. 1B with a photoresist layer deposited and patterned on top.
Figure 1D:
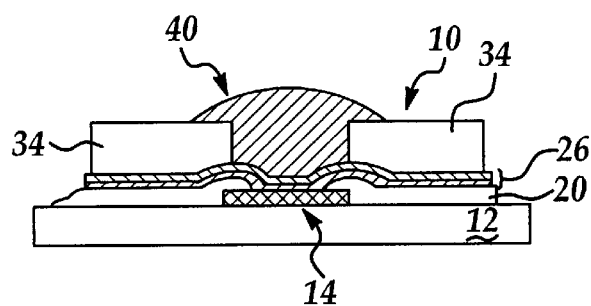
FIG. 1D is an enlarged, cross-sectional view of the conventional semiconductor structure of FIG. 1C with a solder material deposited in the opening for the solder bump.
Figure 1E:
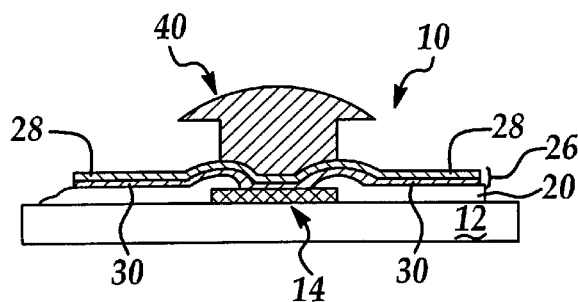
FIG. 1E is an enlarged, cross-sectional view of the conventional semiconductor structure of FIG. 1D with the photoresist layer removed in a wet etching process.
Figure 1F:
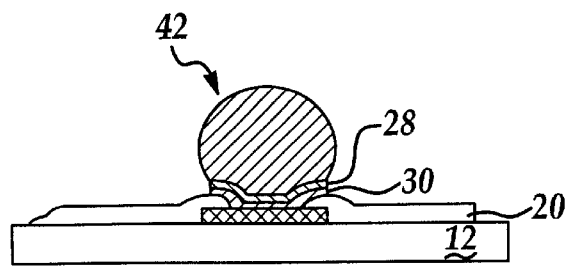
FIG. 1F is an enlarged, cross-sectional view of the conventional semiconductor structure of FIG. 1E with the exposed UBM layer removed and the solder bump reflowed into a solder ball.
Figure 2:
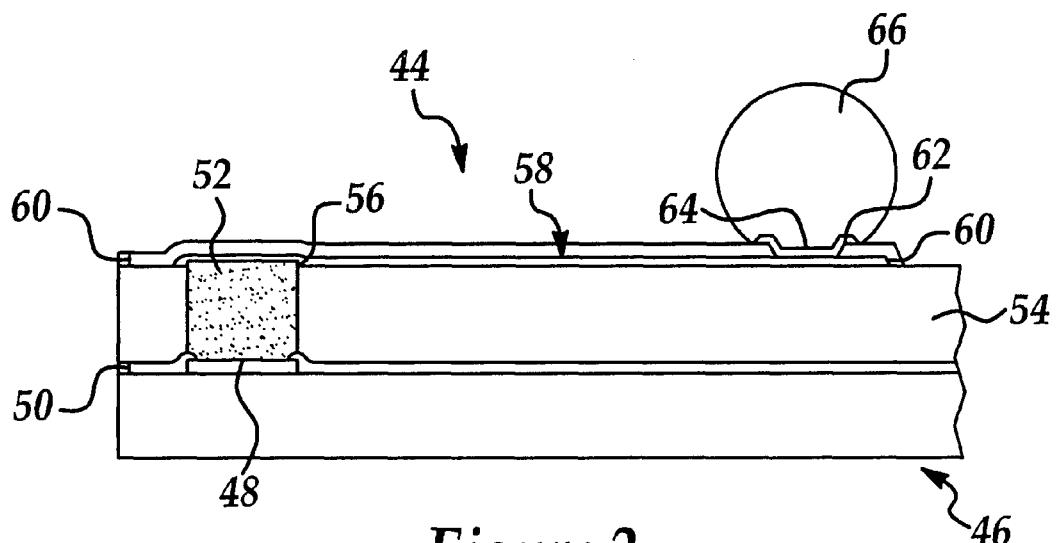
FIG. 2 is an enlarged, cross-sectional view of a conventional wafer level package that incorporates an elastomeric material layer over the entire wafer surface.
Figure 3:
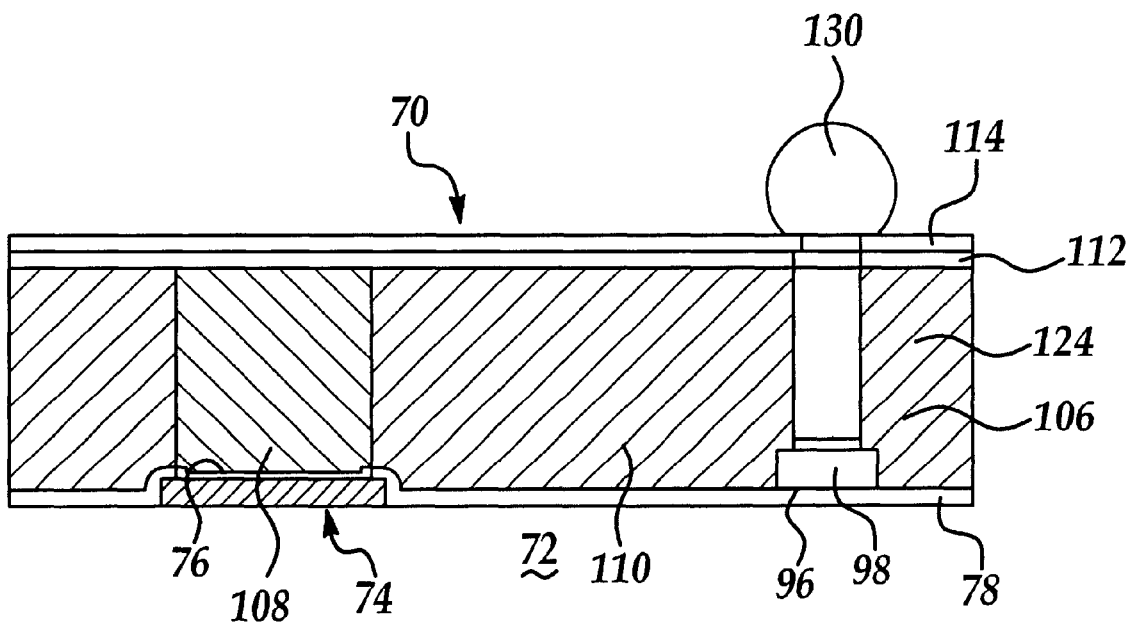
FIG. 3 is an enlarged, cross-sectional view of a present invention wafer level package that incorporates an elastomeric pad in a dummy via plug.
Figure 4:
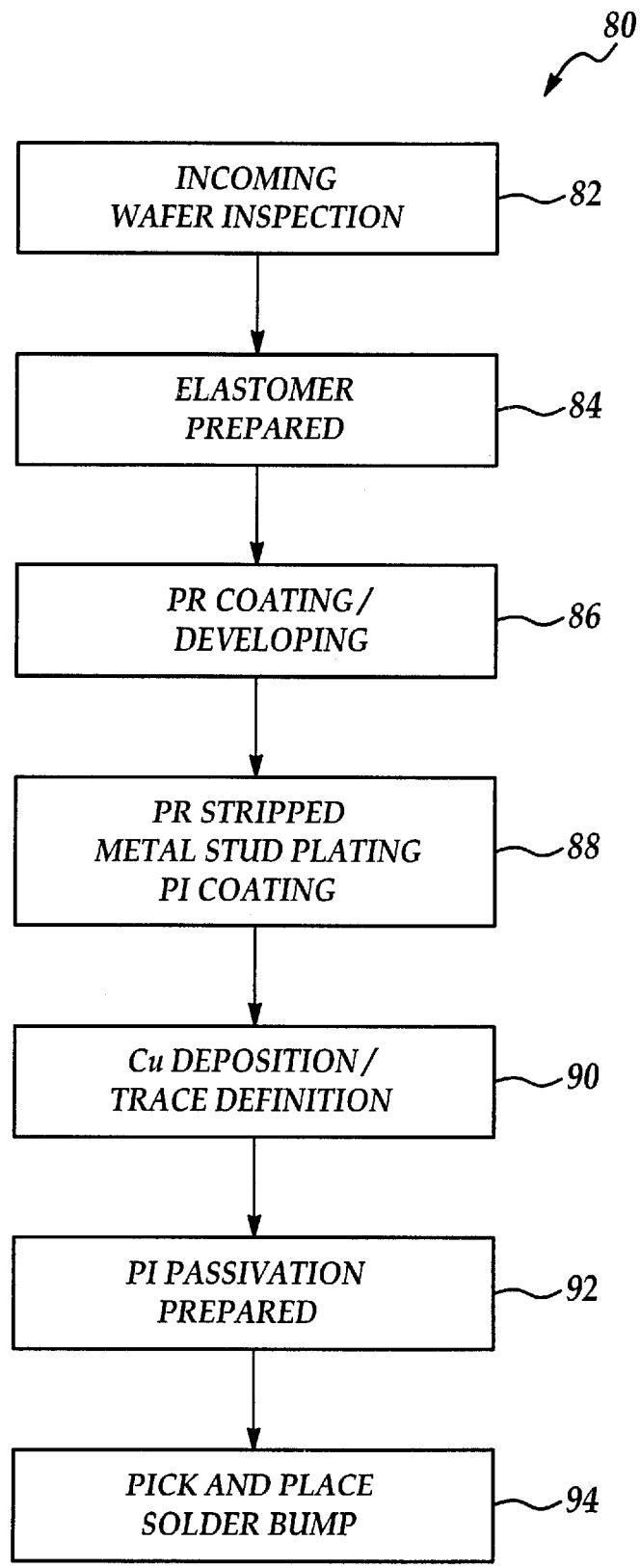
FIG. 4 is a process flow-chart illustrating the present invention method for forming wafer level package incorporating an elastomeric pad in a dummy via plug.

The present invention novel method further provides a wafer level package that does not have a large capacitance problem, i.e. as found in those devices that incorporate a large area elastomeric layer for stress relief. The present invention wafer level package 70 is shown in FIG. 3 in an enlarged, cross-sectional view. A process flow chart 80 for forming the present invention wafer level package is shown in FIG. 4. Moreover, detailed step-by-step process for forming the present invention novel wafer level package is shown in FIGS. 5A~5L.

Figure 5A:
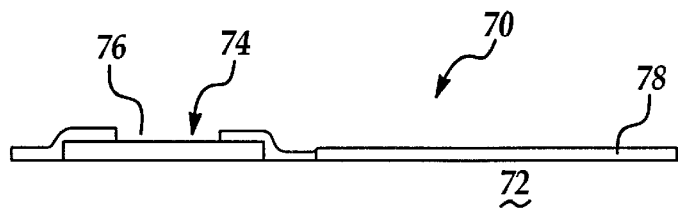
FIG. 5A is an enlarged, cross-sectional view of a present invention pre-processed semiconductor substrate that has a bond pad and a passivation layer formed on top.
Figure 5B:
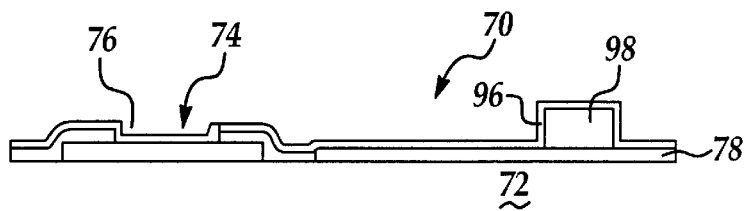
FIG. 5B is an enlarged, cross-sectional view of the present invention semiconductor structure of FIG. 5A with an elastomeric pad formed and a metal nucleation layer sputtered on top.

Referring initially to FIG. 5A, wherein a present invention semiconductor substrate 72 is shown. On top of substrate 72, is first formed a bond pad 74 of aluminum or copper to a thickness of about 1 $\mu$m. The bond pad 74 can be advantageously used for I/O redistribution, i.e. from a peripheral array bond pad to an area array bond (not shown). On top of the bond pad 74, is then deposited and formed window 76 and insulating material layer 78, i.e. a passivation layer. The insulating material layer 78 can be advantageously deposited of silicon oxide, silicon nitride or any other suitable insulating, dielectric material. This is also shown as step 82 as part of an incoming wafer inspection procedure for inspecting the bond pad 74.

On top of the insulating material layer 78, is then formed a multiplicity of insulating pads 98 of an elastic material. The elastic material utilized may be advantageously an elastomer which has a low Young's modulus, i.e. less than 6 MPa/cm$^2$ The multiplicity of insulating pads 98 can be deposited by a printing technique, such as stencil printing or screen printing, into isolated islands for the pads. A suitable diameter of the insulating pad 98 is between about 100 $\mu$m and 500 $\mu$m, and a suitable height is between about 5 $\mu$m and about 100 $\mu$m. In the context of this writing, the word "about" is to mean a range of values of ±10% from the average value given. It should be noted that the insulating pad should be formed of an elastic material of low Young's modulus such that the pad is not too soft or too elastic as to cause other processing or quality problems such as cracking of layers that are deposited on top of the insulating pad 98. The elastomer stencil printing step 84 is also shown in FIG. 4 as the second step.

On top of the insulating material layer 78, is then sputter deposited a thin metal layer 96, such as copper as a nucleation or adhesion layer for promoting adhesion with the subsequently deposited via plug.

Figure 5C:
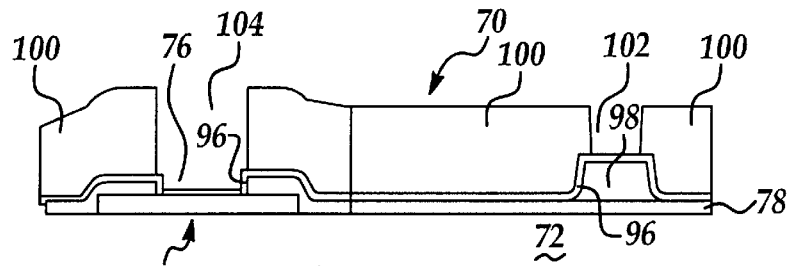
FIG. 5C is an enlarged, cross-sectional view of the present invention semiconductor structure of FIG. 5B with a thick photoresist layer deposited and patterned on top.
Figure 5D:
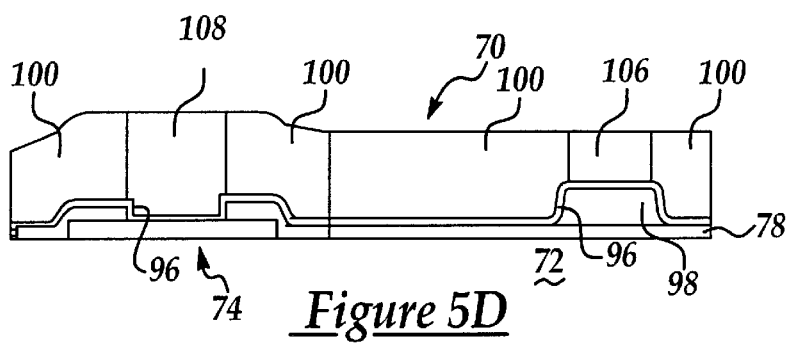
FIG. 5D is an enlarged, cross-sectional view of the present invention semiconductor structure of FIG. 5C with a conductive metal electrodeposited into the via openings.

In the next step of the present invention method, as shown in FIG. 5C and block 86 of FIG. 4, a thick photoresist layer 100 is first deposited and then patterned and formed by a standard photolithographic method to provide openings 102 and 104 for via plugs to be formed. It should be noted that the thick metal layer 96 for nucleation or adhesion is exposed in both openings 102 and 104 to promote bonding with the plug. This is also shown as block 86 in FIG. 4.

Figure 5E:
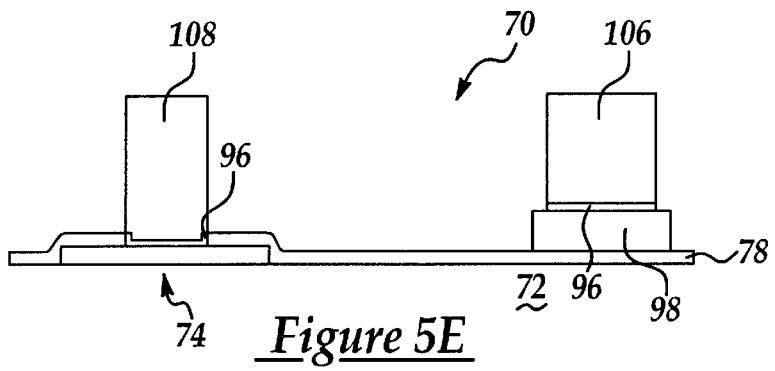
FIG. 5E is an enlarged, cross-sectional view of the conventional semiconductor structure of FIG. 5D with the photoresist layer removed exposing the via plugs.

A conductive metal material is then used to fill the openings 102, 104 to form via plugs 106, 108 by a suitable processing method. Any suitable processing method may be used to fill the conductive metal into the via openings 102, 104. For instance, an electroplating method can be advantageously used to plate copper into the via openings 102, 104. After the via openings are filled, the photoresist layer 100 is stripped away. This is shown in FIG. 5E and block 88 in FIG. 4.

Figure 5F:
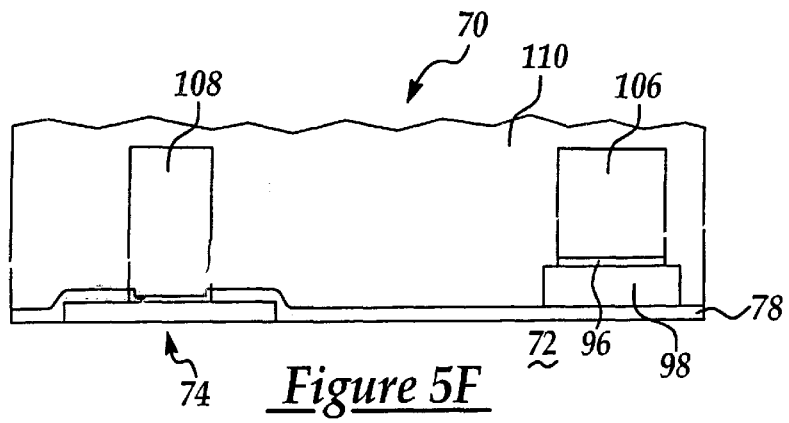
FIG. 5F is an enlarged, cross-sectional view of the present invention semiconductor structure of FIG. 5E with an insulating, stress-relief layer spin-coated on top.

In the next step of the method, shown by block 88 of FIG. 4 and FIG. 5F, an insulating material layer 110, or a support layer, is formed on top of substrate 72. As the name implies, the insulating material layer 110 is mainly used as a support layer for structures to be built on top, i.e. for via plugs 106 and 108. Furthermore, layer 110 is used as a stress relief layer without the drawbacks of a large area elastomeric layer found in conventional structures. The insulating material layer 110 can be suitably formed by a spin coating technique of a material such as polyimide, a mixture of polyimide and elastomer or BCB.

Figure 5G:
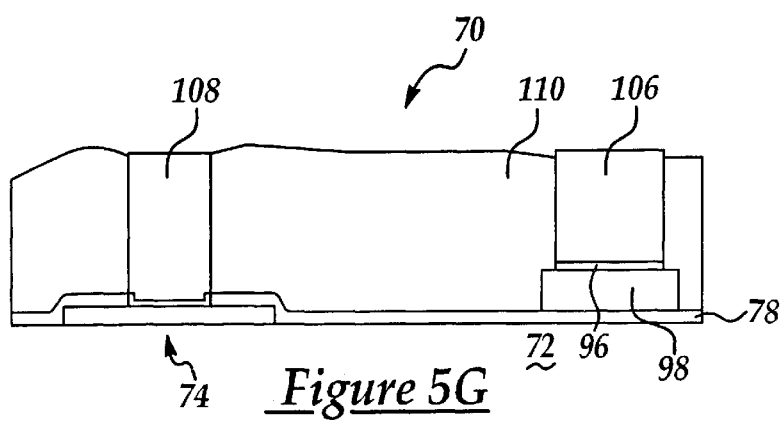
FIG. 5G is an enlarged, cross-sectional view of the present invention semiconductor structure of FIG. 5F with the top layer of the insulating, stress-relief layer removed exposing the top surface of the via plugs.

A dry etching process is then conducted to remove the upper portion of the insulating material layer 110, thus exposing the top surfaces of the via plugs 106 and 108. This is shown in FIG. 5G. The dry etching process also planarize the top surface of the semiconductor 72 to facilitate further processing.

Figure 5H:
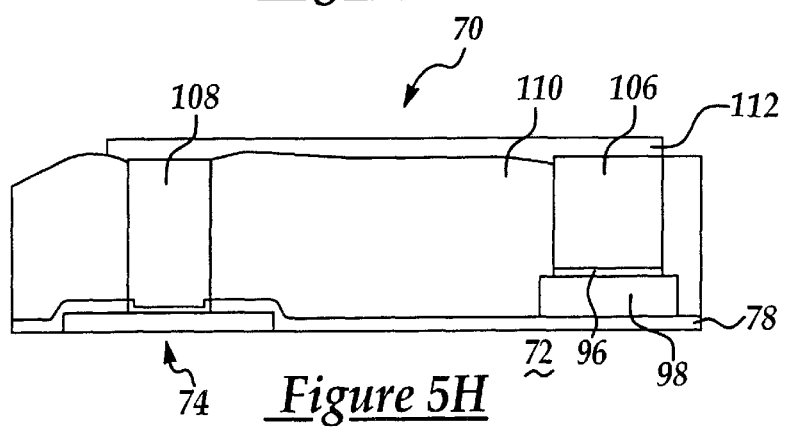
FIG. 5H is an enlarged, cross-sectional view of the present invention semiconductor structure of FIG. 5G with a thin metal layer sputtered and patterned on top for I/O redistribution.

As shown in FIG. 5H and block 90 of FIG. 4, a conductive metal such as aluminum or copper 112 is then deposited, most likely by a sputtering method, to a thickness between about 0.5 $\mu$m and about 3 $\mu$m on top of the semiconductor structure 70. A suitable thickness for the conductive metal is about 1 $\mu$m. The thin metal layer 112 is then defined by a photolithographic method into metal traces, i.e. I/O redistribution lines. The I/O redistribution lines normally extends between a bond pad in an area array and a bond pad in a peripheral array.

Figure 5I:
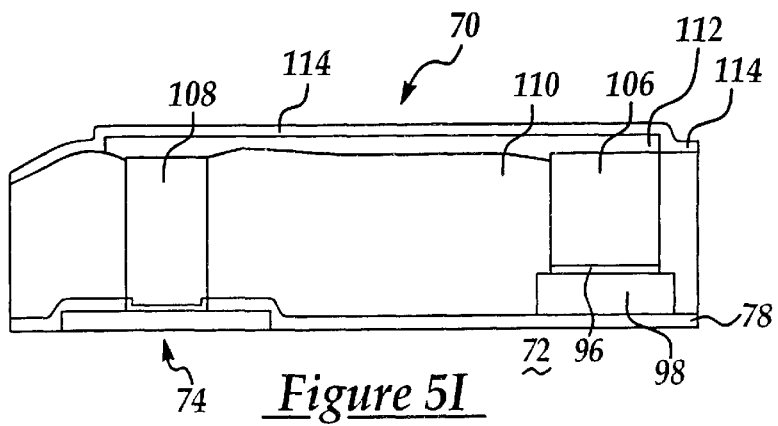
FIG. 5I is an enlarged, cross-sectional view of the present invention semiconductor structure of FIG. 5H with an insulating, passivation material layer deposited on top.

Following the metal trace definition step, a passivation layer 114 of a dielectric material is deposited on top of the semiconductor 70. This is shown in FIG. 5I and step 92 of FIG. 4. The passivation, or dielectric, material utilized should have a low dielectric constant. A suitable material is polyimide or BCB. A suitable thickness for the passivation layer is between about 1 $\mu$m and about 20 $\mu$m, or preferably between about 3 $\mu$m and about 5 $\mu$m.

Figure 5J:
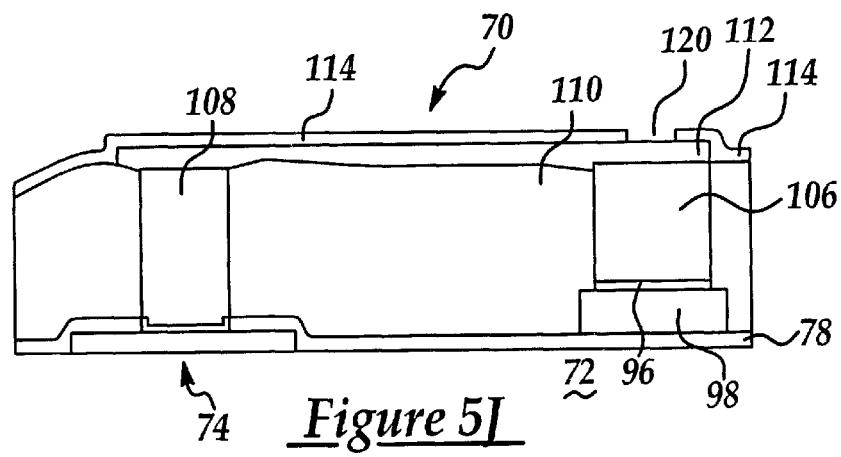
FIG. 5J is an enlarged, cross-sectional view of the present invention semiconductor structure of FIG. 5I with the passivation layer patterned providing a window for the solder bump.
Figure 5K:
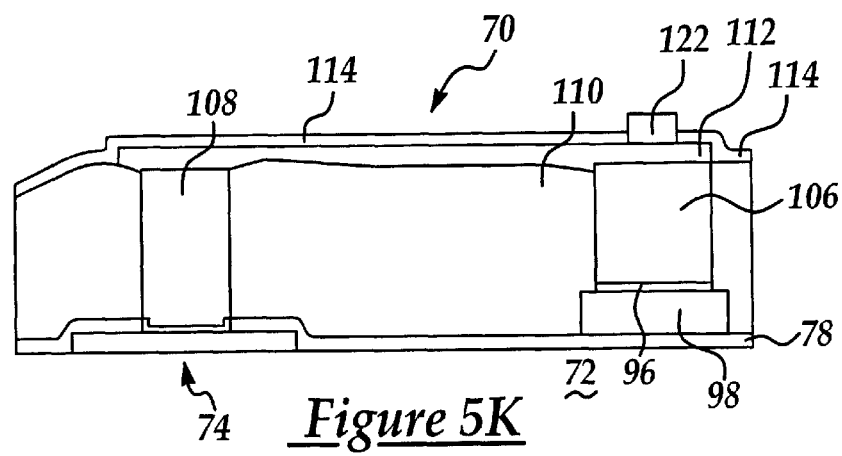
FIG. 5K is an enlarged, cross-sectional view of the present invention semiconductor structure of FIG. 5J with the opening for the solder bump filled with a solder material by an electroplating process.

In the final step of the process, as shown in FIGS. 5J and 5K, a photoresist layer is deposited (not shown) and patterned to open window 120 for a solder bump to be built thereon.

As shown in FIG. 5K and step 94 of FIG. 4, a solder bump 122 is then formed in the opening 120 by a suitable method such as electrodeposition, printed or pick-and-place solder ball technique. Prior to the deposition of the solder bump 122, an additional layer of under-bump-metallurgy 124, shown in FIG. 3, is deposited to facilitate bonding of the solder bump 122 to the conductive metal trace 112. It should be noted that layer 124 is not shown in FIGS. 5K and 5L. The UBM layer can be suitably deposited of materials such as titanium/copper, nickel/gold or any other suitable bonding layers. The solder bump may be formed by a printing technique such as stencil printing or screen printing.

Figure 5L:
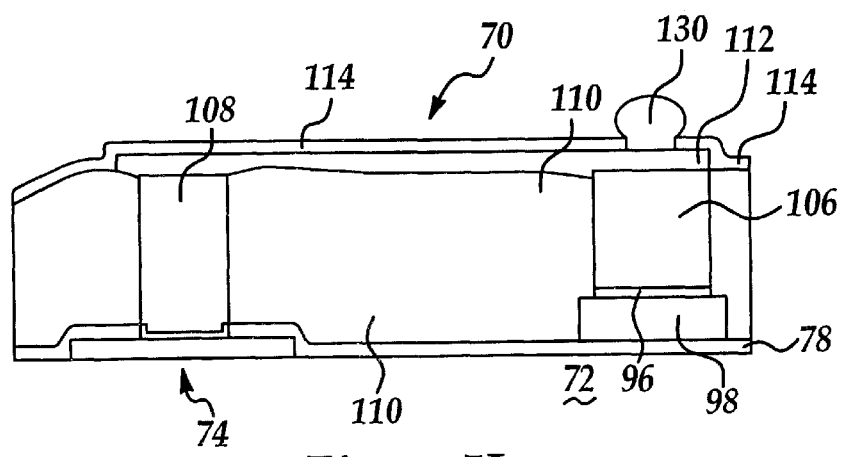
FIG. 5L is an enlarged, cross-sectional view of the present invention semiconductor structure of FIG. 5K with the solder bump reflown into a solder ball.

FIG. 5L illustrates solder ball 130 which is reflown from solder bump 122 through a solder reflow process. The present invention novel I/O redistribution structure is thus completed.

The present invention novel method for forming a wafer level package by incorporating insulating pads of elastic material under dummy via plugs for forming I/O redistribution pads has therefore been amply described in the above description and in the appended drawings of FIGS. 3~5L.

While the present invention has been described in an illustrative manner, it should be understood that the terminology used is intended to be in a nature of words of description rather than of limitation.

Furthermore, while the present invention has been described in terms of a preferred embodiment, it is to be appreciated that those skilled in the art will readily apply these teachings to other possible variations of the inventions.

The embodiment of the invention in which an exclusive property or privilege is claimed are defined as follows.

What is claimed is:

1. A method for forming a wafer level package comprising the steps of:

providing a wafer having a multiplicity of IC dies formed on a top surface, each of said multiplicity of IC dies having a first I/O pad formed in a first insulating layer;

forming an insulating pad of an elastic material on said first insulating layer at a location where a second I/O pad is to be formed;

sputter depositing a first metal nucleation layer on said top surface of the wafer;

coating a layer of photoresist material on top of said first metal nucleation layer and patterning openings for forming via plugs on said first I/O pad and said insulating pad;

filling said openings for forming via plugs with a metal forming said via plugs;

removing said layer of photoresist material and etching away said first metal nucleation layer exposed;

depositing a second insulating layer on top of said first insulating layer and said via plugs;

dry etching a surface layer of said second insulating layer exposing said via plugs;

sputter depositing a metal layer on top of said via plugs and said second insulating layer and defining an I/O redistribution line providing electrical communication between said via plugs;

depositing a third insulating layer on top of said I/O redistribution line;

defining and exposing an opening for said second I/O pad in said third insulating layer; and forming a solder bump on said second I/O pad over said insulating pad.

2. A method for forming a wafer level package according to claim 1, wherein said step of forming a solder bump further comprising depositing an under-bump-metallurgy layer on said second I/O pad prior to forming said solder.

3. A method for forming a wafer level package according to claim 2, wherein said step of forming a solder bump further comprising the steps of:

depositing an under-bump-metallurgy (UBM) layer on said second I/O pad;

depositing a fourth insulating layer overlying said UBM layer;

filling a via hole formed in said fourth insulating layer on said second I/O pad with a solder material forming said solder bump;

removing said fourth insulating layer; and reflowing said solder bump into a solder ball.

4. A method for forming a wafer level package according to claim 3, wherein said solder bump is formed in said via hole by a technique selected from the group consisting of screen printing, stencil printing, electrodeposition and pick-and-place solder ball.

5. A method for forming a wafer level package according to claim 1, wherein said insulating pad is formed of an elastomeric material.

6. A method for forming a wafer level package according to claim 1, wherein said insulating pad is formed of an elastic material having a Young's modulus of less than 20 MPa.

7. A method for forming a wafer level package according to claim 1, wherein said first I/O pad is arranged in a peripheral array on said multiplicity of IC dies.

8. A method for forming a wafer level package according to claim 1, wherein said second I/O pad is arranged in an area array on said multiplicity of IC dies.

9. A method for forming a wafer level package according to claim 1, wherein said insulating pad is formed by a stencil printing technique.

10. A method for forming a wafer level package according to claim 1, wherein said openings for via plugs are formed by a photolithographic method.

11. A method for forming a wafer level package according to claim 1, wherein said first I/O pad and said second I/O pad are formed of aluminum or copper.

12. A method for forming a wafer level package according to claim 1, wherein said via plugs are formed of a material selected from the group consisting of Al, Cu, Al alloys and Cu alloys.

13. A method for forming a wafer level package according to claim 1, wherein said step of filling said openings for via plugs is carried out by an electroplating technique.

14. A method for forming a wafer level package according to claim 1, wherein said metal for forming said via plugs partially covers said insulating pad.

15. A method for forming a wafer level package according to claim 1, wherein said second insulating layer is formed of a material selected from the group consisting of polyamide, polyamide/elastomer mixture and BCB.

* * * * *